(12) United States Patent
Yu et al.

(10) Patent No.: US 10,777,289 B2
(45) Date of Patent: Sep. 15, 2020

(54) SHIFT REGISTER UNIT AND DRIVING METHOD THEREOF, GATE DRIVING CIRCUIT, DISPLAY PANEL AND DISPLAY DEVICE

(71) Applicants: Hefei BOE Optoelectronics Technology Co., Ltd., Anhui (CN); BOE Technology Group Co., Ltd., Beijing (CN)

(72) Inventors: Chaozhi Yu, Beijing (CN); Chuanbao Chen, Beijing (CN); Bowen Qu, Beijing (CN); Huaiwei Yang, Beijing (CN); Kaidi Fang, Beijing (CN); Weiguo Yang, Beijing (CN)

(73) Assignees: Hefei BOE Optoelectronics Technology Co., Ltd., Hefei, Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/417,875

(22) Filed: May 21, 2019

(65) Prior Publication Data
US 2020/0168284 A1 May 28, 2020

(30) Foreign Application Priority Data
Nov. 22, 2018 (CN) .......................... 2018 1 1397200

(51) Int. Cl.
*G06F 3/041* (2006.01)
*G11C 19/28* (2006.01)
(Continued)

(52) U.S. Cl.
CPC ............ *G11C 19/28* (2013.01); *G06F 3/0416* (2013.01); *G09G 3/3266* (2013.01);
(Continued)

(58) Field of Classification Search
CPC .. G06F 3/0416; G09G 3/2096; G09G 3/3266; G09G 3/36; G09G 3/3677; G09G 2300/0408; G09G 2310/0286; G11C 19/28
See application file for complete search history.

(56) References Cited

U.S. PATENT DOCUMENTS 9,785,280 B2 * 10/2017 Pang ...................... G06F 3/0416
10,067,588 B2 * 9/2018 Tan ........................ G06F 3/0416
(Continued)

FOREIGN PATENT DOCUMENTS

| CN | 104217763 A | 12/2014 |
| CN | 104898891 A | 9/2015 |
| CN | 106023945 A | 10/2016 |

OTHER PUBLICATIONS

Apr. 2, 2020 (CN) Office Action application 201811397200.X with English Translation.

*Primary Examiner* — Patrick O Neill
(74) *Attorney, Agent, or Firm* — Banner & Witcoff, Ltd.

(57) ABSTRACT

A shift register unit and a driving method thereof, a gate driving circuit, a display panel and a display device are disclosed. The shift register unit includes a shift circuit and a signal transmission circuit, the output terminal of the shift circuit is connected with the signal transmission circuit, and the shift circuit is configured to output a driving signal to the signal transmission circuit; the signal transmission circuit is configured to be connected to a first input node to receive a touch modulation signal, to output the touch modulation signal to an output node, and to feed back a touch detection signal to the first input node in response to a first level of the driving signal.

20 Claims, 9 Drawing Sheets

(51) Int. Cl.
*G09G 3/36* (2006.01)
*G09G 3/3266* (2016.01)

(52) U.S. Cl.
CPC ... *G09G 3/3677* (2013.01); *G09G 2300/0408* (2013.01); *G09G 2310/0286* (2013.01)

(56) References Cited

U.S. PATENT DOCUMENTS

| | | | |
|---|---|---|---|
| 10,088,944 B2* | 10/2018 | Abe | G06F 3/0416 |
| 10,114,500 B2* | 10/2018 | Huang | G06F 3/0418 |
| 10,152,164 B2* | 12/2018 | Yang | G06F 3/0416 |
| 10,177,173 B2* | 1/2019 | Fan | G06F 3/044 |
| 10,409,402 B2* | 9/2019 | Luo | G06F 3/0416 |
| 10,613,661 B2* | 4/2020 | Huang | G06F 3/0412 |
| 2016/0246418 A1 | 8/2016 | Wang et al. | |
| 2017/0003797 A1 | 1/2017 | Yang | |
| 2017/0075488 A1 | 3/2017 | Lai et al. | |
| 2019/0004355 A1* | 1/2019 | Zeng | G06F 3/0412 |

* cited by examiner

801 — in a touch period, the shift circuit outputting the first level of the driving signal to the signal transmission circuit through the output terminal, and the signal transmission circuit receiving the touch modulation signal from the first input node, and outputting the touch modulation signal to the output node and feeding back the touch detection signal to the first input node in response to the first level of the driving signal 802 — in a display period, the shift circuit outputting the second level of the driving signal to the signal transmission circuit through the output terminal, and the signal transmission circuit receiving the common electrode signal from the second input node and outputting the common electrode signal to the output node in response to the second level of the driving signal

FIG. 8

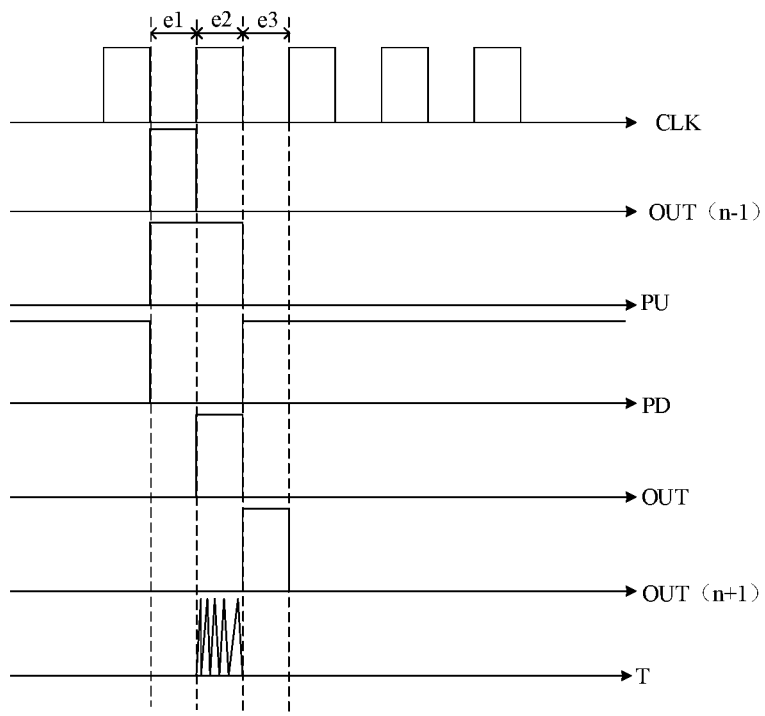

FIG. 9

SHIFT REGISTER UNIT AND DRIVING METHOD THEREOF, GATE DRIVING CIRCUIT, DISPLAY PANEL AND DISPLAY DEVICE

The present application claims priority of Chinese Patent Application No. 201811397200.X filed on Nov. 22, 2018, the disclosure of which is incorporated herein by reference in its entirety as part of the present application.

TECHNICAL FIELD

Embodiments of disclosure relate to a shift register unit and a driving method thereof, a gate driving circuit, a display panel and a display device.

BACKGROUND

As a touch and display driver integration (TTDI) product, a full in cell (FIC) touch panel is widely applied in display devices. The FIC touch panel may generally include a plurality of touch electrodes arranged in an array and touch detection signal lines connected to the plurality of touch electrodes in a one-to-one corresponding manner.

SUMMARY

The embodiment of the disclosure provides a shift register unit, which comprises a shift circuit and a signal transmission circuit. The output terminal of the shift circuit is connected with the signal transmission circuit, and the shift circuit is used for outputting a driving signal to the signal transmission circuit; the signal transmission circuit is configured to be connected to a first input node to receive a touch modulation signal, output the touch modulation signal to an output node in response to a first level of the driving signal, and feedback the touch detection signal to the first input node.

In some examples, the driving signal is a gate scan signal, and the output of the shift circuit is also connected to the scan signal input to provide the driving signal to the scan signal input terminal.

In some examples, the signal transmission circuit is further configured to be connected to a second input node to receive a common electrode signal and output the common electrode signal to the output node in response to a second level of the driving signal.

In some examples, the signal transmission circuit includes a first signal transmission sub-circuit and a second signal transmission sub-circuit, the first signal transmission sub-circuit being connected to the first input node, the output terminal of the shift circuit, and the output node, respectively, and configured to receive the touch modulation signal from the first input node and output the touch modulation signal to the output node in response to a first level of the driving signal; the second signal transmission sub-circuit is respectively connected to the output terminal, the second input node, and the output node of the shift circuit, and is configured to receive the common electrode signal from the second input node and output the common electrode signal to the output node in response to a second level of the driving signal.

In some examples, the second signal transmission sub-circuit includes a first control sub-circuit and a second control sub-circuit, the first control sub-circuit being connected to the second control sub-circuit through a first node; the first control sub-circuit is configured to write a control signal to the first node in response to the driving signal to control the voltage of the first node; the second control sub-circuit is configured to be connected to the output node to receive the common electrode signal and output the common electrode signal to the output node in response to the control signal written to the first node.

In some examples, the first control sub-circuit includes an inverting circuit whose input terminal and output terminal are respectively connected to the output of the shift circuit and the first node, and the inverting circuit is configured to provide an inverting signal of the driving signal to the first node as the control signal.

In some examples, the first signal transmission sub-circuit includes a first transistor, the first control sub-circuit includes a second transistor and a third transistor, and the second control sub-circuit includes a fourth transistor; the gate of the first transistor is connected with the output terminal of the shift circuit, the first electrode of the first transistor is connected with the first input node to receive the touch modulation signal and feedback the touch detection signal, and the second electrode of the first transistor is connected with the output node; the grid of the second transistor is connected with the output terminal of the shift circuit, the first electrode of the second transistor is connected with the first power supply end, and the second electrode of the second transistor is connected with the first node; the grid and the first electrode of the third transistor are both connected with a second power supply terminal, and the second electrode of the third transistor is connected with the first node; the gate of the fourth transistor is connected to the first node, the first electrode of the fourth transistor is connected to the second input node to receive the common electrode signal, and the second electrode of the fourth transistor is connected to the output node.

In some examples, the second signal transmission sub-circuit includes a fifth transistor; the gate of the fifth transistor is connected to the output terminal of the shift circuit, the first electrode of the fifth transistor is connected to the second input node, and the second electrode of the fifth transistor is connected to the output node.

In some examples, the shift circuit includes an input sub-circuit, an output sub-circuit, a reset sub-circuit and a pull-down sub-circuit, the input sub-circuit being connected to a pull-up node and configured to provide an input signal to the pull-up node in response to a first control signal; the output circuit is connected to the pull-up node and the output terminal, and is configured to write a first level of the driving signal to the output terminal in response to a level of the pull-up node; the reset sub-circuit is connected to the pull-up node and configured to reset the pull-up node in response to a second control signal; the pull-down sub-circuit is connected to the output terminal and configured to write a second level of the driving signal to the output terminal in response to a second control signal.

The embodiment of the present disclosure also provides a driving method of the shift register unit, which comprises: in a touch phase, an output terminal of the shift circuit outputs a first level of the driving signal to the signal transmission circuit, and the signal transmission circuit receives the touch modulation signal from the first input node, outputs the touch modulation signal to the output node in response to the first level of the driving signal, and feeds back the touch detection signal to the first input node.

In some examples, the driving method further includes: in a display stage, an output terminal of the shift circuit outputs a second level of the driving signal to the signal transmission circuit, which receives the common electrode signal from the second input node and outputs the common electrode signal to the output node in response to the second level of the driving signal.

In some examples, the driving method further includes: in the touch phase, in response to a first level of the driving signal, a switching transistor of a pixel unit is turned on, and a display data signal is transmitted from a first electrode to a second electrode of the switching transistor; in the display stage, in response to the display data signal and the common electrode signal, the pixel unit realizes a display operation.

The embodiment of the disclosure also provides a gate driving circuit, which comprises a plurality of cascaded shift register units.

The embodiment of the disclosure also provides a touch display panel, which comprises a plurality of touch electrodes and the gate driving circuit. The plurality of shift register units correspond to the plurality of touch electrodes one by one; the output node of each shift register unit is connected with the corresponding touch electrode.

In some examples, the touch display panel further includes a plurality of gate lines and a plurality of touch detection signal lines, the plurality of shift register units respectively correspond to the plurality of grid lines and the plurality of touch detection signal lines one by one, the output terminal of the shift circuit in each shift register unit is connected with the corresponding grid line, and the output node in each shift register unit is connected to the corresponding touch electrode through the corresponding touch detection signal line.

In some examples, the plurality of gate lines and the plurality of touch detection signal lines are parallel to each other.

In some examples, the plurality of touch electrodes are arranged in an array of n rows and m columns, the plurality of touch detection lines all extend along the row direction of the array, the plurality of touch detection lines are divided into n groups of touch detection signal lines, and the n groups of touch detection signal lines respectively correspond to the n rows of touch electrodes one by one; each group of touch detection signal lines comprises M touch detection signal lines which are respectively connected with M touch electrodes in a corresponding row of touch electrodes in a one-to-one corresponding manner.

In some examples, the touch display panel further includes touch detection signal lines configured to be respectively connected to first input nodes of the plurality of shift register units to input the touch modulation signal to the first input node and receive the touch detection signal.

In some examples, the touch display panel further includes a common electrode line configured to be respectively connected to second input nodes of the plurality of shift register cells to input a common electrode signal to the second node.

The embodiment of the disclosure also provides a display device, which comprises the touch display panel and the touch processing circuit. The touch processing circuit is configured to be respectively connected with the plurality of shift register units in the touch display panel to provide touch modulation signals to the plurality of shift register units and receive the touch detection signals from the plurality of shift register units.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

FIG. 8 is a flowchart of a driving method of a shift register unit provided by an embodiment of the present disclosure;

FIG. 9 is a timing chart of each signal terminal in a shift register unit provided by an embodiment of the present disclosure;

DETAILED DESCRIPTION

Figure 1:
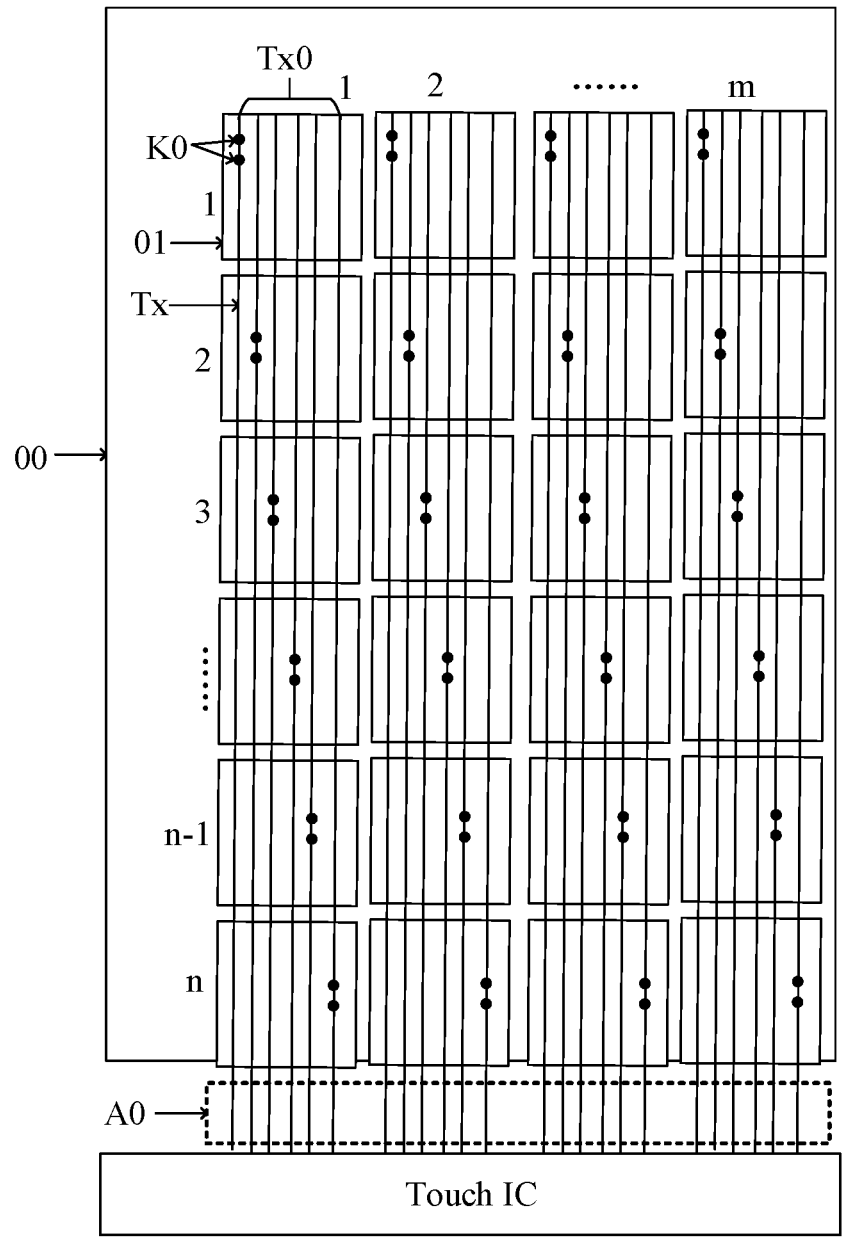
FIG. 1 is a schematic structural diagram of a touch display device.

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Furthermore, in various embodiments of the present disclosure, same or similar reference numerals refer to same or similar components. Transistors used in all embodiments of the present disclosure may be thin film transistors or field effect transistors or other devices with the same characteristics. Since a source electrode and a drain electrode of the transistor used here are symmetrical, the source electrode and the drain electrode are interchangeable. In the embodiment of the present disclosure, one of the source electrode and the drain electrode is referred to as a first electrode and the other is referred to as a second electrode. In addition, transistors used in the embodiment of the present disclosure may include any one of a P-type transistor and an N-type transistor, wherein the P-type transistor is turned on when the gate electrode is at a low level, turned off when the gate is at a high level, and the N-type transistor is turned on when the gate is at a high level, and turned off when the gate is at a low level.

In an FIC display panel, a plurality of touch detection signal lines are all parallel to data lines in the display panel, each touch detection signal line is connected with a touch integrated circuit (IC) positioned at one side of the FIC panel, and the touch detection signal lines are used for transmitting touch detection signals between the touch IC and touch electrodes in a touch phase. However, since the plurality of touch detection signal lines need to be respectively connected with the touch IC in the related art, the number of traces in the lead areas around the touch display panel is large.

FIG. 1 is a schematic structural diagram of a touch display device. As shown in FIG. 1, the touch display device may include a touch display panel 00 and a touch IC, and the touch display panel 00 may include a plurality of touch electrodes 01 arranged in an array.

Exemplarily, as shown in FIG. 1, the touch display panel 00 includes n multiplied by m of touch electrodes 01, and a plurality of groups of touch detection signal lines Tx0; m and n are positive integers not less than 1. Each touch detection signal line Tx in each group of touch detection signal lines Tx0 can be connected to one touch electrode 01 and the touch IC, and the touch electrodes 01 connected to each group of touch detection signal lines Tx0 are located in a same column. Each touch detection signal line Tx can be connected to one touch electrode 01 through at least one via hole K0; for example, referring to FIG. 1, each touch detection signal line Tx can be connected to one touch electrode 01 through two via holes K0. The touch IC can output a touch modulation signal through a touch detection line Tx to the touch electrode 01 which is connected to the touch detection signal line Tx, and the touch detection signal line Tx can output a touch detection signal fed back by the touch electrode 01 connected to the touch detection signal line Tx to the touch IC. The touch IC can determine whether the touch electrode 01 is touched according to the received touch detection signal, thereby realizing touch detection.

However, for a touch display panel including n rows and m columns of touch electrodes, the number of touch detection signal lines Tx connected to the touch IC is n*m, so that the number of traces in the lead region A0 around the touch display panel is large. Correspondingly, the touch IC needs to be provided with a large number of lead interfaces, and thus a size of the touch IC to be provided is large, which is against to a realization of a narrow frame display device. In addition, a higher wiring density of the lead region A0 will decrease a light transmittance of the touch display panel, which further results in a lower curing rate of UV glue and a lower yield of the display device when the touch display panel is packaged by ultraviolet (UV) irradiation ultraviolet curing glue (i.e., UV glue).

Embodiments of the disclosure provide a shift register unit which can be applied to a touch panel to provide the touch modulation signal and receive a feedback touch control signal, thereby realizing a touch control detection function; on the basis of realizing touch detection, the number of traces required to be set in the lead area around the touch display panel can be reduced, thereby solving the above series of problems caused by the large number of traces.

Figure 2A:
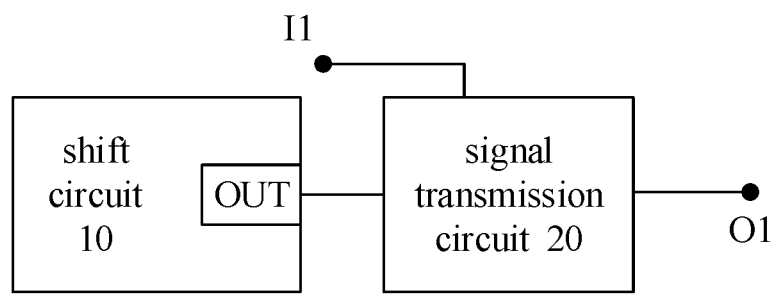
FIG. 2A is a first structural schematic diagrams of a shift register unit provided by an embodiment of the present disclosure.

As shown in FIG. 2A, the shift register unit includes a shift circuit 10 and a signal transmission circuit 20. An output terminal OUT of the shift circuit 10 is connected to the signal transmission circuit 20, and the shift circuit 10 is used for outputting a driving signal to the signal transmission circuit 20. The signal transmission circuit 20 is configured to be connected to a first input node I1 to receive a touch modulation signal, to output the touch modulation signal to an output node O1 in response to a first level of the driving signal, and to feed back a touch detection signal to the first input node I1. For example, the shift register circuit 10 can realize a shift register function. Under a control signal of an external circuit, a shift register pulse signal (i.e., the above-mentioned driving signal) is generated. When a plurality of shift register units are cascaded, the signal serves as both a control signal of a current row (e.g., an on signal of transistors of the current row), and a start signal of a next row and an end signal of a previous row. A detailed description of the shift circuit 10 may refer to the description of FIG. 7 in the embodiment of the present disclosure.

For example, the output node O1 is connected with a touch electrode. For example, the touch electrode is a self-capacitance touch electrode, and the touch electrode receives the touch modulation signal. When a human finger touches the touch electrode, a self-capacitance of the touch electrode changes, causing a signal change on the touch electrode, thereby generating a touch detection signal on the touch electrode (or the touch detection signal is generated from the touch modulation signal by touch induction). The touch detection signal is fed back to the IC circuit through the first input node I1 and is analyzed to obtain a position of the touch point, thus realizing the touch detection function.

Figure 2B:
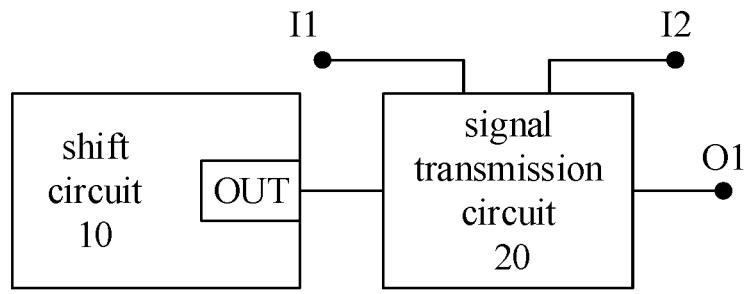
FIG. 2B is a second structural diagram of a shift register unit provided by an embodiment of the present disclosure.

For example, the driving signal can also be used as a gate scan signal, and the output terminal OUT of the shift circuit is also connected to a scan signal input terminal to provide the driving signal. For example, the output terminal OUT of the shift circuit 10 may also be connected to a gate line of the display panel (refer to FIG. 12), so that the driving signal is also configured to drive the display panel by scanning. In this case, the shift register unit can be applied to a touch display panel, driving display pixels and touch electrodes at the same time. As shown in FIG. 2B, the signal transmission circuit 20 may be further configured to be connected to a second input node I2 to receive a common electrode signal and to output the common electrode signal to the output node O1 in response to a second level of the driving signal. In this case, the shift register unit can be applied to a display touch panel, and the touch electrode connected to the output node O1 also serves as a common electrode at the same time, that is, when the driving signal is at a first level, the electrode connected to the output node O1 serves as a touch electrode to realize a touch detection function; when the driving signal is at the second level, the electrode connected to the output node O1 serves as a common electrode (for example, a common electrode in a liquid crystal display panel or a common electrode in an organic light emitting diode display panel) to realize a display function.

In another case, the touch electrode may be disposed independently from the common electrode instead of being multiplexed as the common electrode. The embodiments of the present disclosure are not limited thereto. For example, when the shift register unit is applied to an organic light emitting diode (OLED) display panel, a layer of transparent conductive material can be formed on a side of a cover glass of the OLED remote from the organic light emitting device, and the transparent conductive material is patterned to form the touch electrode. In this case, the touch electrode and the common electrode (cathode or anode of the organic light emitting device) of the OLED display panel are respectively disposed on opposite sides of the cover glass.

Figure 2C:
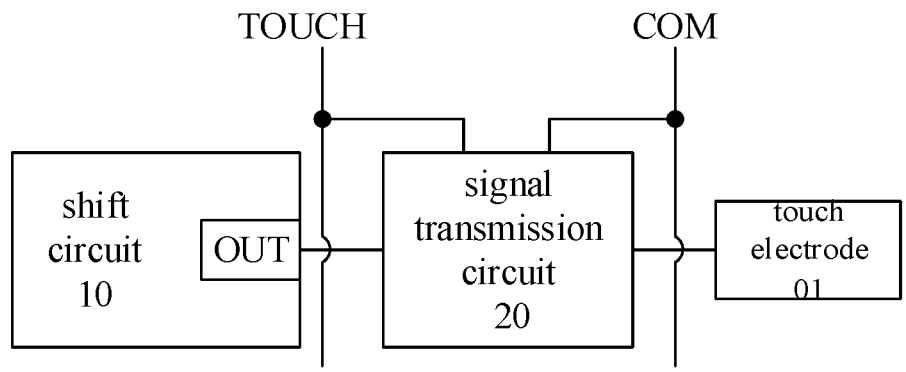
FIG. 2C is a third structural diagram of a shift register unit provided by an embodiment of the present disclosure.

FIG. 2C shows a schematic diagram of the shift register unit applied to a display touch panel. As shown in FIG. 2C, the signal transmission circuit 20 may be respectively connected to a touch detection signal line TOUCH, a common electrode line COM and a touch electrode 01 in the panel. The signal transmission circuit 20 may output a touch modulation signal from the touch detection signal line TOUCH to the touch electrode 01, and output the touch detection signal fed back by the touch electrode 01 to the touch detection signal line TOUCH, in response to the first level of the driving signal; and may output a common electrode signal from the common electrode line COM to the touch electrode 01 in response to the second level of the driving signal. The touch detection signal line touch can be respectively connected with the touch IC and a plurality of shift register units.

For example, the signal transmission circuit 20 may output a common electrode signal from the common electrode line COM to the touch electrode 01 when the potential of the driving signal is at the second level. At this time, the touch electrode 01 can be used as a common cathode in an OLED display panel integrated with a touch function to drive a light emitting unit to emit light together with an anode; alternatively, the touch electrode 01 can be used as a common electrode in a liquid crystal display panel integrated with a touch function to drive liquid crystal deflection together with pixel electrodes to realize pixel luminescence.

The signal transmission circuit 20 can output a touch modulation signal from the touch detection signal line TOUCH to the touch electrode 01, and output the touch detection signal fed back by the touch electrode 01 to the touch detection signal line TOUCH, when the potential of the driving signal is the first level. At this time, the touch detection signal line TOUCH can output the received touch detection signal fed back by the touch electrode 01 to the touch IC. The touch IC can determine a position of the touch electrode 01 that feeds back the touch detection signal according to a time of the received touch detection signal and a working sequence of the shift register unit, thus realizing the function of touch detection. The first level is different from the second level, which may be a low potential with respect to the first level, for example.

By way of example, the touch IC may store in advance an operation timing of each stage of shift register unit and a corresponding relationship between a position of each stage of shift register unit and the touch electrode 01 (i.e., the position of the touch electrode 01 to which each stage shift register unit is connected). When the touch control IC receives the touch detection signal transmitted by the touch detection signal line TOUCH, it can determine the shift register unit (that is, the shift register unit that transmits the touch detection signal) a current output driving signal potential of which shift register unit is the first level according to a time when the touch detection signal is received and the working timing of each shift register unit. After that, a specific position of the touch electrode 01 that feeds back the touch detection signal can be determined according to the corresponding relationship between the positions of the shift register units of each stage and the touch electrode 01, and then the touch position in the touch display panel can be determined.

For example, a material of the touch electrode 01 may be indium tin oxide (ITO), and the touch display panel may be an FIC touch panel.

The embodiment of the disclosure provides a shift register unit. The shift register unit includes a shift circuit and a signal transmission circuit connected to the shift circuit. The signal transmission circuit can receive the touch modulation signal from the first input node, output the touch modulation signal and feedback the touch detection signal to the first input node under a control of the driving signal output by the shift circuit. As the touch IC can be respectively connected with the first input nodes of a plurality of shift register units through one touch detection signal line and each shift register unit can be connected with one touch electrode, touch detection of each touch electrode included in the touch display panel can be realized by setting a small number of touch detection signal lines. The shift register unit provided by the embodiment of the present disclosure can reduce the number of traces in lead regions around the touch display panel relative to the case where touch detection signal lines with the same number of touch electrodes need to be provided to realize touch detection of each touch electrode included in the touch display panel.

Figure 3:
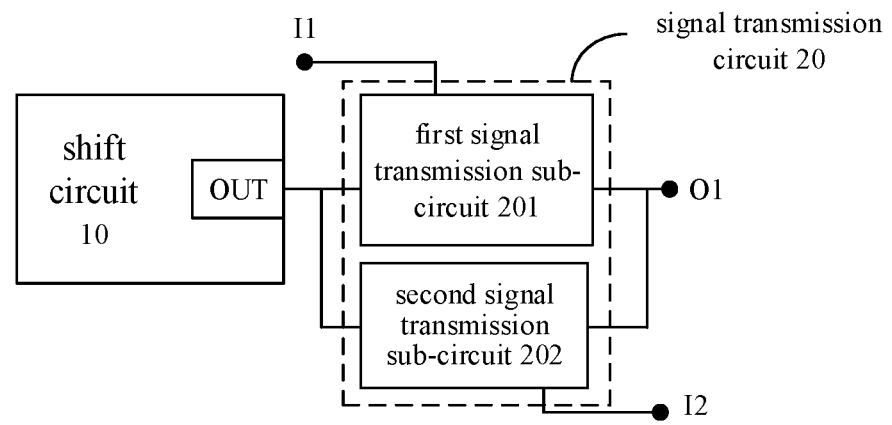
FIG. 3 is a fourth structural diagram of a shift register unit provided by an embodiment of the present disclosure.

FIG. 3 is a schematic structural diagram of a shift register unit provided by an embodiment of the present disclosure, which shows a specific example of the shift register unit shown in FIG. 2B. As shown in FIG. 3, the signal transmission circuit 20 may include a first signal transmission sub-circuit 201 and a second signal transmission sub-circuit 202.

The first signal transmission sub-circuit 201 may be respectively connected to the output terminal OUT of the shift circuit 10, the first input node I1 and the output node O1, and configured to receive the touch modulation signal from the first input node I1, to output the touch modulation signal to the output node O1, and to feed back the touch detection signal to the first input node in response to the first level of the driving signal. The second signal transmission sub-circuit 202 is respectively connected to the output terminal OUT of the shift circuit 10, the second input node I2 and the output node O1, and is configured to receive the common electrode signal from the second input node I2 and output the common electrode signal to the output node O1 in response to the second level of the driving signal.

The first level is configured to switch on the first signal transmission sub-circuit 201 and switch off the second signal transmission sub-circuit 202; the second level is configured to switch on the second signal transmission sub-circuit 202 and switch off the first signal transmission sub-circuit 201.

Figure 4:
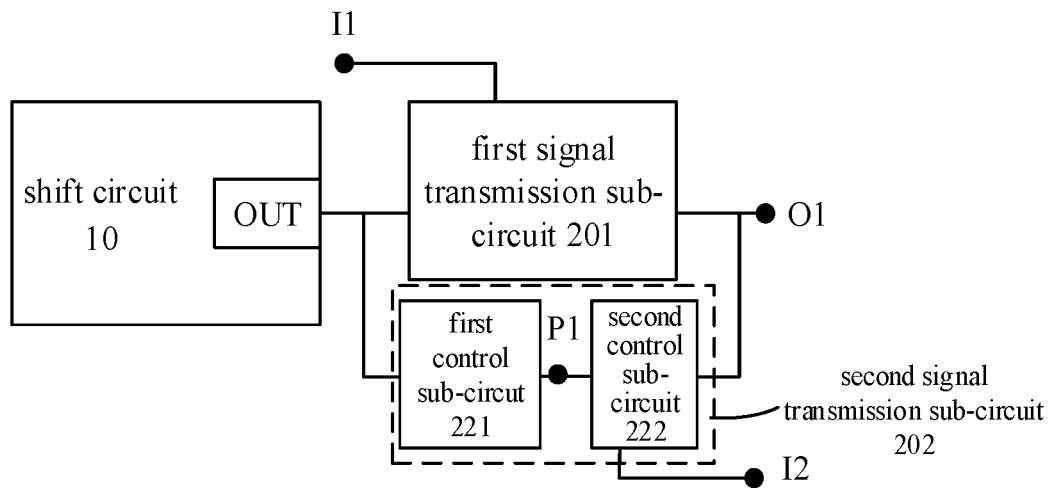
FIG. 4 is a fifth structural diagram of a shift register unit provided by an embodiment of the present disclosure.

For example, as shown in FIG. 4, the second signal transmission sub-circuit 201 includes a first control sub-circuit 221 and a second control sub-circuit 222, and the first control sub-circuit 221 is connected to the second control sub-circuit 222 through a first node P1. The first control sub-circuit 221 is configured to write a control signal to the first node P1 in response to the driving signal to control a voltage of the first node P1; the second control sub-circuit 222 is configured to be connected to the second input node I2 to receive the common electrode signal, and to be connected with the output node O1 to output the common electrode signal to the output node O1 in response to the control signal.

Figure 5:
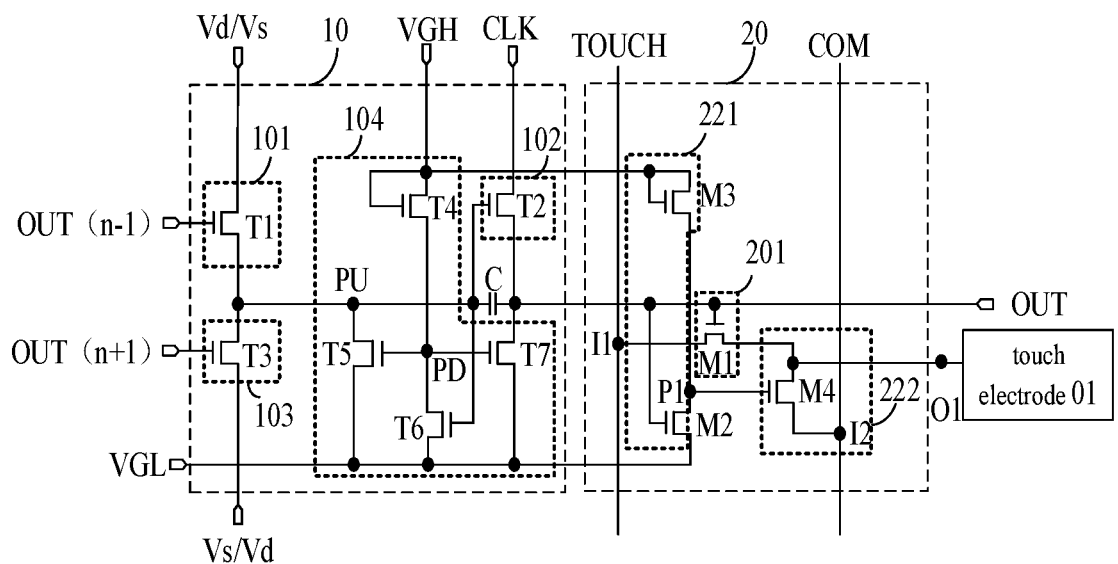
FIG. 5 is a sixth structural diagram of a shift register unit provided by an embodiment of the present disclosure.

FIG. 5 is a schematic structural diagram of a shift register unit provided by another embodiment of the present disclosure, which shows an example of the shift register unit applied to a touch display panel. As shown in FIG. 5, the first control sub-circuit 221 is connected to a first power supply terminal VGL (e.g., a low voltage terminal) and a second power supply terminal VGH (e.g., a high voltage terminal), respectively. The first signal transmission sub-circuit 201 can output a touch modulation signal to the touch electrode 01 and output a touch detection signal to the touch detection signal line TOUCH in response to the first level of the driving signal. At this time, the first control sub-circuit 221 outputs the first power supply signal provided by the first power supply terminal VGL to the first node P1 in response to the first level, and the second control sub-circuit 222 turns off in response to the first power supply signal.

The first control sub-circuit 221 may also output a second power supply signal provided by the second power supply terminal VGH to the first node P1 in response to the second level of the driving signal, and the second control sub-circuit 222 is turned on in response to the first power supply signal, thereby outputting the common electrode signal to the touch electrode 01.

In another example, the first control sub-circuit 221 includes an inverting circuit, an input terminal and an output terminal of which are respectively connected to the output terminal OUT of the shift circuit 10 and the first node P1, and the control signal is an inverted signal of the driving signal.

As shown in FIG. 5, the first signal transmission sub-circuit 201 may include a first transistor M1. The first control sub-circuit 221 may include a second transistor M2 and a third transistor M3. The second control sub-circuit 222 may include a fourth transistor M4.

A gate electrode of the first transistor M1 may be connected to the output terminal OUT of the shift circuit 10, and a first electrode of the first transistor M1 may be connected to the first input node I1 to be connected to the touch detection signal line TOUCH, thereby receiving the touch modulation signal from the touch detection signal line and feeding back the touch detection signal to the touch detection signal line; a second electrode of the first transistor M1 may be connected to the output node O1 to be connected to the touch electrode 01.

A gate electrode of the second transistor M2 may be connected to the output terminal OUT of the shift circuit 10, a first electrode of the second transistor M2 may be connected to the first power supply terminal VGL (for example, a low voltage terminal), and a second electrode of the second transistor M2 may be connected to the first node P1.

A gate electrode and a first electrode of the third transistor M3 may both be connected to a second power supply terminal VGH (e.g., a high voltage terminal), and a second electrode of the third transistor M3 may be connected to the first node P1.

A gate electrode of the fourth transistor M4 may be connected to the first node P1, a first electrode of the fourth transistor M4 may be connected to the second input node I2 to connect to the common electrode line COM, and the second electrode of the fourth transistor M4 may be connected to the output node O1 to connect to the touch electrode 01.

In the embodiment shown in FIG. 5, the first transistor M1, the second transistor M2, the third transistor M3, and the fourth transistor M4 are all n-type transistors, so the first level is a high level and the second level is a low level.

Figure 6:
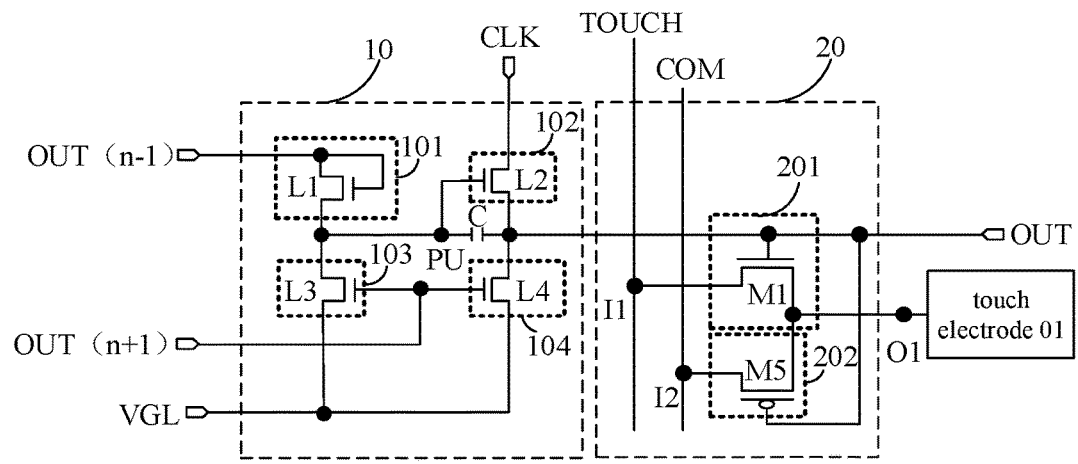
FIG. 6 is a seventh structural diagram of a shift register unit provided by an embodiment of the present disclosure.

FIG. 6 is a schematic structural diagram of a shift register unit provided by still another embodiment of the present disclosure, which shows another example of the shift register unit applied in a touch display panel. As shown in FIG. 6, different from the embodiment shown in FIG. 5, the second signal transmission sub-circuit includes a fifth transistor M5, which is of an opposite type to the first transistor M1. For example, the first transistor M1 is an N-type transistor and the fifth transistor M5 is a P-type transistor. A gate electrode of the fifth transistor M5 is connected to the output terminal OUT of the shift circuit 10, a first electrode of the fifth transistor M5 is connected with the second input node I2 so as to be connected to the common electrode line COM, and a second electrode is connected with the output node O1 so as to be connected to the touch electrode 01.

When the driving signal is at the first level, such as a high level, in response to the first level, the first transistor M1 is turned on and the fifth transistor M5 is turned off, thereby allowing the signal transmission circuit 20 to output the touch modulation signal to the touch electrode 01 and to feed back a touch detection signal to the touch detection signal line TOUCH.

When the driving signal is at the second level, for example, a low level, in response to the second level, the first transistor M1 is turned off and the fifth transistor M5 is turned on, thereby allowing the signal transmission circuit 20 to output the common electrode signal to the touch electrode 01.

For example, in the embodiment of the present disclosure, the touch display panel may be an amorphous silicon (a-Si) display panel, a low temperature poly-silicon (LTPS) display panel, or an oxide display panel. The transistors used in the a-Si display panel and the oxide display panel are generally N-type transistors, and the transistors used in the LTPS display panel may be either N-type transistors or P-type transistors. Therefore, for the a-Si display panel and the oxide display panel, a shift register unit as shown in FIG. 4 or FIG. 5 can be used. For the LTPS display panel, the shift register unit shown in FIG. 6 can be used.

Figure 7:
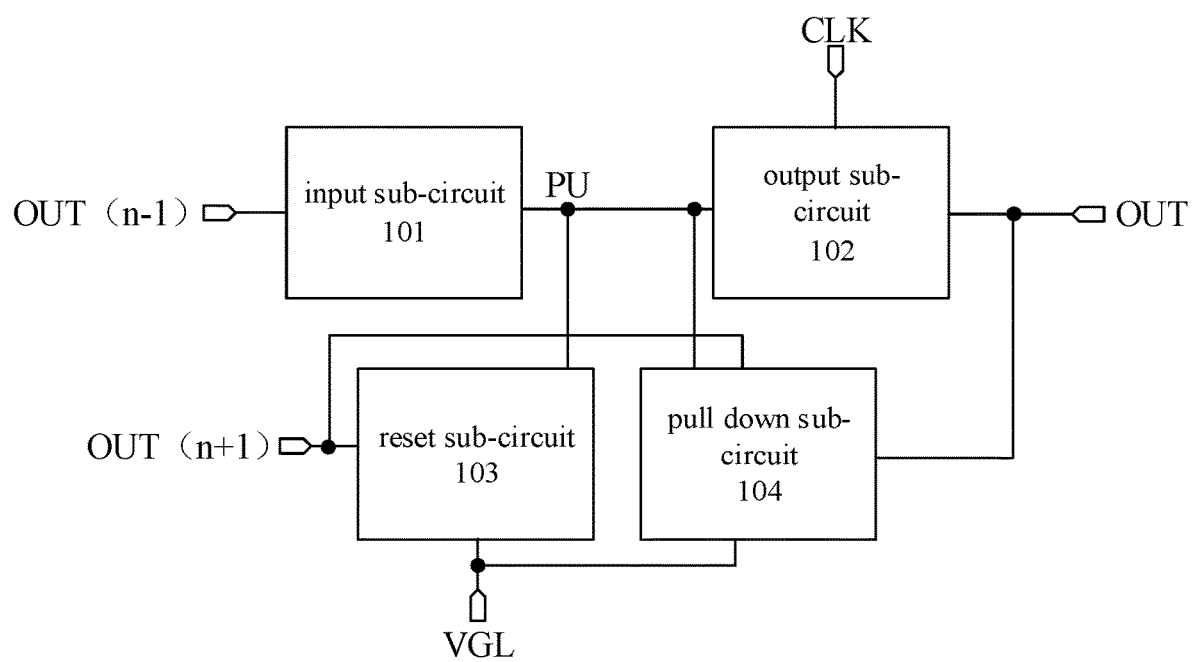
FIG. 7 is a schematic structural diagram of a shift circuit provided by an embodiment of the present disclosure.

FIG. 7 is a schematic structural diagram of a shift circuit provided by an embodiment of the present disclosure. As shown in FIG. 7, the shift circuit 10 may include an input sub-circuit 101, an output sub-circuit 102, a reset sub-circuit 103, and a pull-down sub-circuit 104. The input sub-circuit is connected to a pull-up node and configured to provide an input signal to the pull-up node in response to a first control signal; the output circuit is connected to the pull-up node and the output terminal, and is configured to write the first level of the driving signal to the output terminal under the control of the level of the pull-up node; the reset sub-circuit is connected to the pull-up node and configured to reset the pull-up node in response to a second control signal; the pull-down sub-circuit is connected to the output terminal and configured to write the second level of the driving signal to the output terminal in response to a third control signal.

For example, as shown in FIG. 7, the second control signal and the third control signal may be same.

For example, the input sub-circuit 101 may be respectively connected to the output terminal OUT(n−1) and the pull-up node PU of the shift circuit 10 of a previous stage of shift register unit. In response to an output signal (i.e., the input signal of the current stage) provided by the output terminal OUT(n−1) of the shift circuit 10 of the previous stage of shift register unit, the input sub-circuit 101 can output the output signal to the pull-up node PU so as to charge the pull-up node PU.

For example, the output sub-circuit 102 may be connected to a clock signal terminal CLK, the pull-up node PU, and the output terminal OUT, respectively. The output sub-circuit 102 may output a clock signal from the clock signal terminal CLK, i.e., the driving signal at the first level, to the output terminal OUT in response to a potential of the pull-up node PU.

For example, the reset sub-circuit 103 may be respectively connected to the output terminal OUT(n+1), the first power supply terminal VGL, and the pull-up node PU of the shift circuit 10 of a next stage of shift register unit. The reset sub-circuit 103 may output the first power supply signal provided by the first power supply terminal VGL to the pull-up node PU in response to the output signal provided by the output terminal OUT(n+1) of the shift circuit 10 of the next stage of shift register unit to realize a reset of the pull-up node PU.

For example, the pull-down sub-circuit 104 may be respectively connected to the output terminal OUT(n+1), the first power supply terminal VGL, the pull-up node PU, and the output terminal OUT of the shift circuit 10 of the next stage of shift register unit. The pull-down sub-circuit 104 may output the first power supply signal provided by the first power supply terminal VGL, i.e., the driving signal of the second level, to the pull-up node PU and the output terminal OUT in response to the output signal provided by the output terminal OUT(n+1) of the shift circuit 10 of the previous stage of shift register unit, so as to realize noise reduction to the pull-up node PU and the output terminal OUT.

For example, the input sub-circuit 101 may also be connected to the second power supply terminal VGH, and the input sub-circuit 101 may also pull up the node PU to output the second power supply signal provided by the second power supply terminal in response to the output signal provided by the output terminal OUT(n−1) of the shift circuit 10 of the previous stage of shift register unit. The pull-down sub-circuit 104 may be connected to the first power supply terminal VGL, the second power supply terminal VGH, the pull-up node PU and the output terminal OUT, respectively, and the pull-down sub-circuit 104 may output a first power supply signal to the pull-up node and the output terminal respectively in response to the second power supply signal.

For example, referring to FIG. 5, the output sub-circuit 101 may include a transistor T1, a gate electrode of which may be connected to the output terminal OUT(n−1) of the shift circuit 10 of the previous stage of shift register unit, a first electrode may be connected to a high-level power supply terminal (Vd) or a low-level power supply terminal (Vs), and a second electrode may be connected to the pull-up node PU.

The output sub-circuit 102 may include a transistor T2, a gate electrode of which may be connected to the pull-up node PU, a first electrode may be connected to the clock signal terminal CLK, and a second electrode may be connected to the output terminal OUT.

The reset sub-circuit 103 may include a transistor T3, a gate electrode of which may be connected to the output terminal OUT(n+1) of the shift circuit 10 of the next stage of shift register unit, a first electrode may be connected to a low-level power supply terminal (Vs) or a high-level power supply terminal (Vd), and a second electrode may be connected to the pull-up node PU.

The pull-down sub-circuit 104 may include a transistor T4, a transistor T5, a transistor T6, and a transistor T7. A gate electrode and a first electrode of the transistor T4 may both be connected to the second power supply terminal VGH, and the second electrode may be connected to the pull-down node PD. A gate electrode of the transistor T5 may be connected to the pull-down node PD, a first electrode may be connected to the first power supply terminal VGL, and a second electrode may be connected to the pull-up node PU. A gate electrode of the transistor T6 may be connected to the pull-up node PU, the first electrode may be connected to the first power supply terminal VGL, and a second electrode may be connected to the pull-down node PD. A gate electrode of the transistor T7 may be connected to the pull-down node PD, a first electrode may be connected to the first power supply terminal VGL, and a second electrode may be connected to the output terminal OUT. And referring to FIG. 4, it can be seen that the shift circuit 10 may further include a capacitor C, one end of which may be connected to the pull-up node PU, the other end may be connected to the output terminal OUT, and the capacitor C may be used for storing signals.

For example, the high-level power supply terminal Vd may be the second power supply terminal VGH, and the low-level power supply terminal Vs may be the first power supply terminal VGL.

For example, referring to FIG. 6, the input sub-circuit 101 may include a transistor L1. A gate and a first electrode of the transistor L1 may both be connected to the output terminal OUT(n−1) of the shift circuit 10 of the previous stage of shift register unit, and a second electrode may be connected to the pull-up node PU.

The output sub-circuit 102 may include a transistor L2, a gate electrode of which may be connected to the pull-up node PU, a first electrode may be connected to the clock signal terminal CLK, and a second electrode may be connected to the output terminal OUT.

The reset sub-circuit 103 may include a transistor L3, a gate electrode of which may be connected to the output terminal OUT(n+1) of the shift circuit 10 of the next stage of shift register unit, a first electrode may be connected to the first power supply terminal VGL, and a second stage may be connected to the pull-up node PU.

The pull-down sub-circuit 104 may include a transistor L4, a gate electrode of which may be connected to the output terminal OUT(n+1) of the shift circuit 10 of the next stage of shift register unit, a first electrode may be connected to the first power supply terminal VGL, and a second electrode may be connected to the output terminal OUT. And referring to FIG. 6, the shift circuit 10 may also include a capacitor C, one end of which may be connected to the pull-up node PU and the other end may be connected to the output terminal OUT.

It should be noted that in the description of various embodiments of the present disclosure, the first input node I1, the second input node I2, the output node O1, and the first node P1 do not necessarily represent actual components, but may represent the junction points of related circuit connections in the circuit diagram.

An embodiment of the disclosure provides a shift register unit. The shift register unit includes a shift circuit and a signal transmission circuit connected to the shift circuit. The signal transmission circuit can receive the touch modulation signal from the first input node, and output the touch modulation signal and further feed back the touch detection signal to the touch detection signal line through the first input node under the control of the driving signal output by the shift circuit. As the touch IC can be respectively connected with a plurality of shift register units through one touch detection signal line and each shift register unit can be connected with one touch electrode, touch detection on each touch electrode included in the touch display panel can be realized by setting a small number of touch detection signal lines. The shift register unit provided by the embodiment of the present disclosure can reduce the number of traces in lead regions around the touch display panel relative to the case where touch detection signal lines with the same number of touch electrodes need to be provided to realize touch detection of each touch electrode included in the touch display panel.

An embodiment of the present disclosure also provides a driving method of the shift register unit, which can be applied in the shift register unit provided by any embodiment of the present disclosure. The driving method includes step S801: in a touch period, the shift circuit outputting the first level of the driving signal to the signal transmission circuit through the output terminal, and the signal transmission circuit receiving the touch modulation signal from the first input node, and outputting the touch modulation signal to the output node and feeding back the touch detection signal to the first input node in response to the first level of the driving signal.

FIG. 8 shows a schematic flow chart of the driving method. as shown in FIG. 8, the driving method may further include step S802: in a display period, the shift circuit outputting the second level of the driving signal to the signal transmission circuit through the output terminal, and the signal transmission circuit receiving the common electrode signal from the second input node and outputting the common electrode signal to the output node in response to the second level of the driving signal. In this case, the shift register unit can be applied in a display touch panel, and the touch electrode connected to the output node O1 also serves as a common electrode at the same time, that is, when the driving signal is at the first level, the electrode connected to the output node O1 serves as a touch electrode to realize a touch detection function; when the driving signal is at the second level, the electrode connected to the output node O1 serves as a common electrode (for example, a common electrode in a liquid crystal display panel or a common electrode in an organic light emitting diode display panel) to realize a display function.

For example, the driving method further includes: in the touch period, in response to the first level of the driving signal, a switching transistor (such as a thin film transistor 13 in FIG. 13) located in a pixel unit of a display region switching on, and transmitting a display data signal from a first electrode to a second electrode of the switching transistor; in the display period, the pixel unit realizing a display operation in response to the display data signal and the common electrode signal. In this case, the shift register unit can be applied in the touch display panel, and the driving signal is also used as a gate scanning signal to scan and drive the display panel, that is, the shift register unit drives the display pixel unit and the touch electrode simultaneously.

The embodiment of the disclosure provides a driving method of a shift register unit. The signal transmission circuit can output the touch modulation signal received from the first input node to the output node and output the touch detection signal fed back by the output node to the touch detection signal line under the control of the driving signal output by the shift circuit. As the touch IC can be connected with a plurality of shift register units through one touch detection signal line, each shift register unit can be connected with one touch electrode. Therefore, touch detection of all touch electrodes included in the touch display panel can be realized by setting a small number of touch detection signal lines. Compared with the situation that touch detection signal lines with the same number of touch electrodes need to be arranged to realize touch detection of all touch electrodes included in the touch display panel, the driving method of the shift register unit provided by the embodiment of the disclosure can allow the number of traces in lead regions around the touch display panel to be small.

For example, taking the shift register unit shown in FIG. 5 as an example, and taking each transistor in the shift register unit as an N-type transistor and the first potential as a low potential with respect to the second potential as an example, the driving principle of the signal transmission circuit 20 in the shift register unit provided by the embodiment of the present disclosure is described in detail.

In the touch period, the potential of the driving signal output from the output terminal OUT of the shift circuit 10 is a second potential (i.e. the above-mentioned first level of the driving signal). At this time, the first transistor M1 and the second transistor M2 are turned on, and the first power supply terminal VGL outputs a first power supply signal to the first node P1 through the second transistor M2. The potential of the first power supply signal is the first potential, and the fourth transistor M4 is turned off. The touch modulation signal from the touch detection signal line touch is output to the touch electrode 01 through the first transistor M1. Moreover, the touch electrode 01 can output a touch detection signal to the touch detection signal line TOUCH through the first transistor M1.

In the display period, the potential of the driving signal output from the output terminal OUT of the shift circuit 10 is the first potential (i.e. the above-mentioned second level of the driving signal), and the potential of the second power supply signal provided by the second power supply terminal VGH is the second potential. The first transistor M1 and the second transistor M2 are turned off, and the third transistor M3 is turned on. The second power supply terminal VGH outputs the second power supply signal to the first node P1 through the third transistor M3, the fourth transistor M4 is turned on, and the common electrode signal from the common electrode line COM is output to the touch electrode 01 through the fourth transistor M4.

In another example, taking the shift register unit shown in FIG. 6 as an example, and taking the first transistor M1 in the shift circuit as an n-type transistor, the fifth transistor M5 as a p-type transistor, and the first potential as a low potential with respect to the second potential as an example, the driving principle of the signal transmission circuit 20 in the shift register unit provided by the present disclosure will be described in detail.

In the touch period, the potential of the driving signal output from the output terminal OUT of the shift circuit 10 is the second potential (i.e. the above-mentioned first level of the driving signal). At this time, the first transistor M1 is turned on and the fifth transistor M5 is turned off. The touch modulation signal from the touch detection signal line Touch is output to the touch electrode 01 through the first transistor M1.

In the display period, the potential of the driving signal output from the output terminal OUT of the shift circuit 10 is the first potential (i.e. the above-mentioned second level of the driving signal). At this time, the first transistor M1 is turned off and the fifth transistor M1 is turned on. The common electrode signal from the common electrode line COM is output to the touch electrode 01 through the fifth transistor M5.

For example, in the embodiment of the present disclosure, when the touch electrode 01 receives a common electrode signal from the common electrode line COM in the display period, the touch electrode 01 can be used as a cathode in an OLED display panel integrated with a touch function to drive the light emitting unit to emit light together with the anode; alternatively, the touch electrode 01 can be used as a common electrode in a liquid crystal display panel integrated with a touch function to drive liquid crystal deflection together with pixel electrodes to realize pixel luminescence. When the touch detection signal line Touch receives the touch detection signal fed back by the touch electrode 01 in the touch period, it can output the touch detection signal to the touch IC. In this situation, the touch IC can determine the position of the touch electrode 01 that feeds back the touch detection signal according to the time when the touch detection signal is received and the working timing of the shift register unit, thus realizing the touch detection function.

In addition, taking the shift register unit shown in FIG. 5 as an example, and taking each transistor in the shift register unit as an n-type transistor, and taking the first potential as a low potential relative to the second potential as an example, the driving principle of the shift register unit provided by the embodiment of the present disclosure is introduced.

FIG. 9 is a timing chart of each signal terminal of a shift register unit provided by an embodiment of the present disclosure. Referring to FIG. 9, it can be seen that in the first stage e1, the potential of the driving signal output by the output terminal OUT(n−1) of the previous stage of shift register unit is the second potential, and the transistor T1 in the shift circuit 10 is turned on. Assuming that the first electrode of the transistor T1 is connected to the high-level power supply terminal Vd, in this situation, the high-level power supply terminal Vd can output a second power supply signal to the pull-up node PU through the transistor T1 to charge the pull-up node PU.

In the second stage e2, the potential of the clock signal provided by the clock signal terminal CLK is the second potential. Due to the bootstrap effect of the capacitor C, the potential of the pull-up node PU can be kept at the second potential, and the transistor T2 is turned on. The clock signal terminal CLK outputs a clock signal at a second potential to the output terminal OUT through the transistor T2. The clock signal is the driving signal output by the output terminal OUT, and the potential of the driving signal is the second potential at this time. The output terminal OUT can output the clock signal of the second potential to a gate line and a signal transmission circuit 20 respectively. For example, in response to the output signal, switching transistors (such as thin film transistor 13 in FIG. 13) in a row of pixel units corresponding to the gate line in the display panel are turned on, and a display data signal is transmitted from a first electrode to a second electrode of the switching transistor to be written to the pixel circuit. Furthermore, referring to FIG. 9, it can be seen that in the second stage e2, the signal transmission circuit 20 can output the touch modulation signal T from the touch detection signal line TOUCH to the touch electrode 01 under the control of the driving signal, i.e., the above-mentioned touch period can be the second stage e2.

In the third stage e3, the potential of the driving signal output from the output terminal OUT(n+1) of the next stage of shift register unit is the second potential, and the transistor T3 is turned on. Assuming that the first electrode of the transistor T3 is connected to a low-level power supply terminal Vs, the low-level power supply terminal Vs can output a signal at a low level to the pull-up node PU through the transistor T3 to reset the pull-up node PU. In this situation, the transistor T6 is turned off, the potential of the second power supply signal provided by the second power supply terminal VGH is the second potential, and the transistor T4 is turned on. The second power supply terminal VGH outputs a second power supply signal to the pull-down node PD through the transistor T4, the transistors T5 and T7 are turned on, the first power supply terminal VGL outputs a first power supply signal to the pull-up node PU through the transistor T5, and outputs a first power supply signal to the output terminal OUT through the transistor T7, thereby realizing noise reduction to the pull-up node PU and the output terminal OUT. In this situation, the potential of the driving signal output from the output terminal OUT becomes the first potential, and the signal transmission circuit 20 can output a common electrode signal from the common electrode line COM to the touch electrode 01 under the control of the driving signal, and the touch electrode 10 serves as the common electrode in this situation. For example, in response to the display data signal written in the previous stage and the common electrode signal, the display pixel realizes a display operation. The above display period may be the third stage e3.

From the above, it can be seen that the touch-control period can be integrated into the above-mentioned display process and does not occupy the actual display time, so reusing the common electrode as a touch-control electrode will not shorten the display time and will not adversely affect the display.

For example, assuming that the resolution (HD) of the touch display panel is 60 Hz, the shift register unit is driven unilaterally. There are 360 effective shift register units on each side of the touch display panel. The display time of each frame of the touch display panel is 1 second (s)/60=16.7 milliseconds (ms). Correspondingly, a duration of a phase in which each stage of shift register unit outputs the driving signal is 16.7 ms/360=46 microseconds (us). Since each stage of shift register unit is connected to one touch electrode 01, the touch detection time for each touch electrode 01 can be 46 us, which can meet the demand of touch detection.

Figure 14:
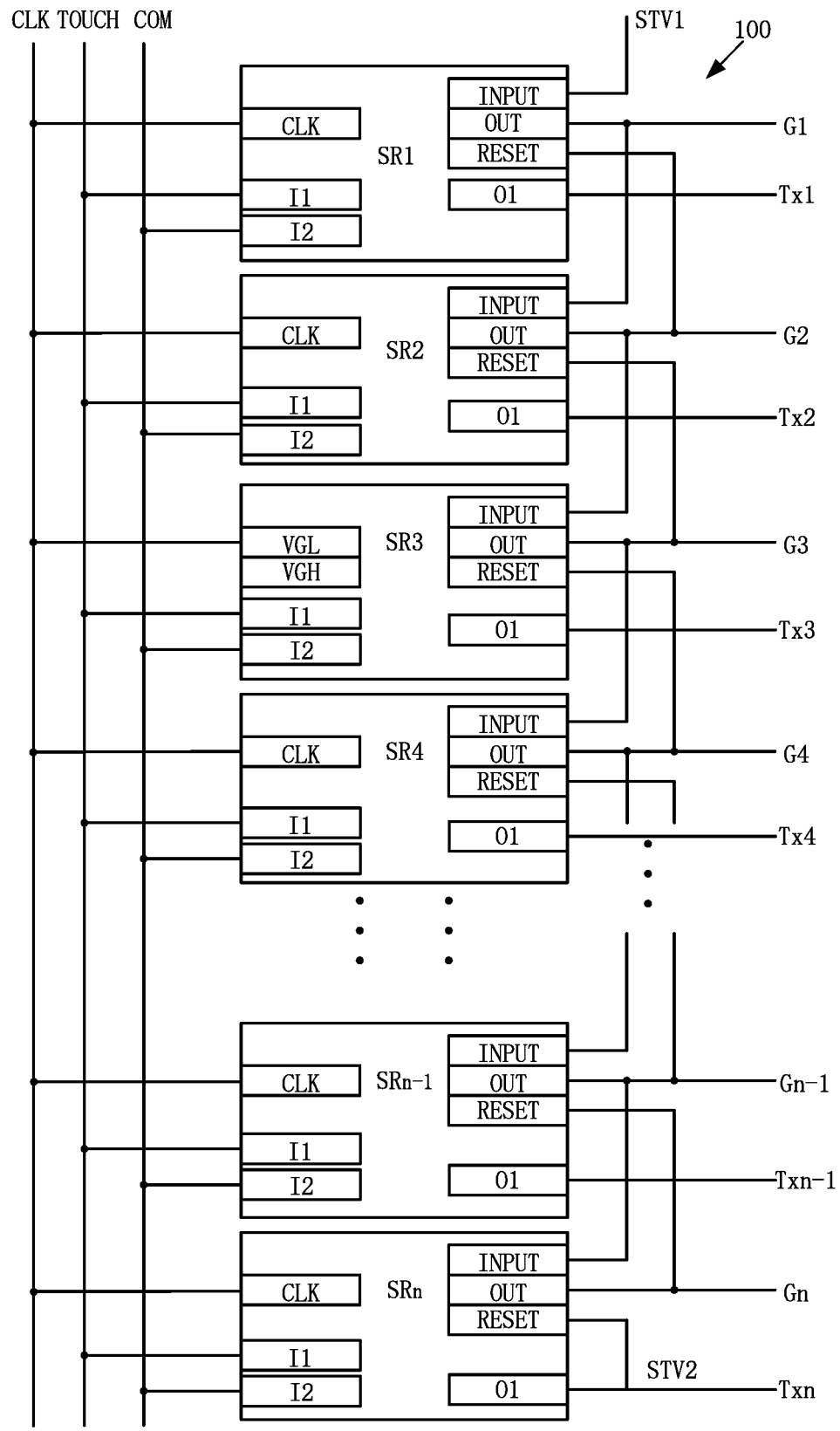
FIG. 14 is a schematic diagram of a gate driving circuit provided by an embodiment of the present disclosure.

The embodiment of the present disclosure provides a gate drive circuit, and FIG. 14 shows a schematic diagram of a gate drive circuit provided by the embodiment of the present disclosure. The gate drive circuit 100 may include a plurality of cascaded shift register units provided by any embodiment of the present disclosure.

As shown in FIG. 14, the gate driving circuit 100 includes n-stage shift register units SR1, SR2 . . . SRn, each of which can be the shift register unit provided by any embodiment of the present disclosure. The output terminals OUT of the shift register units SR1, SR2 . . . SRn are respectively connected to gate lines G1, G2 . . . Gn, and their output nodes O1 are respectively connected to touch detection signal lines Tx1, TX2 . . . Txn.

In addition to the first-stage and last-stage shift register units, the input control terminal of the current stage of shift register unit (configured to provide an input control signal INPUT, for example, the gate electrode of the transistor T1 described above) is connected to the output terminal OUT of the previous stage of shift register unit; the reset control terminal of the current stage of shift register unit (configured to provide a reset control signal RESET, for example, the gate electrode of the transistor T3 described above) is connected to the output terminal OUT of the next stage of shift register unit.

For example, the input terminal of the first stage of shift register unit is connected to a first trigger signal terminal to receive a first trigger signal STV1; the reset signal terminal of the last stage of shift register unit is connected to a second trigger signal terminal to receive a second trigger signal STV2.

For example, when the gate driving circuit 100 scans in a forward direction, the first trigger signal STV1 serves as the input signal of the first stage of shift register unit and the second trigger signal STV2 serves as the reset signal of the last stage of shift register unit. When the gate drive circuit scans backward, the second trigger signal STV2 serves as the input signal of the last stage of shift register unit, and the first trigger signal STV1 serves as the reset signal of the first stage of shift register unit. For example, when the forward scan and the backward scan are switched, the functions of the input circuit and the reset circuit of the shift register unit are exchanged. The plurality of shift register units can be connected with a same touch detection signal line TOUCH; that is, the gate driving circuit can be connected to the touch control circuit (i.e. IC) through one touch detection signal line TOUCH.

Figure 10:
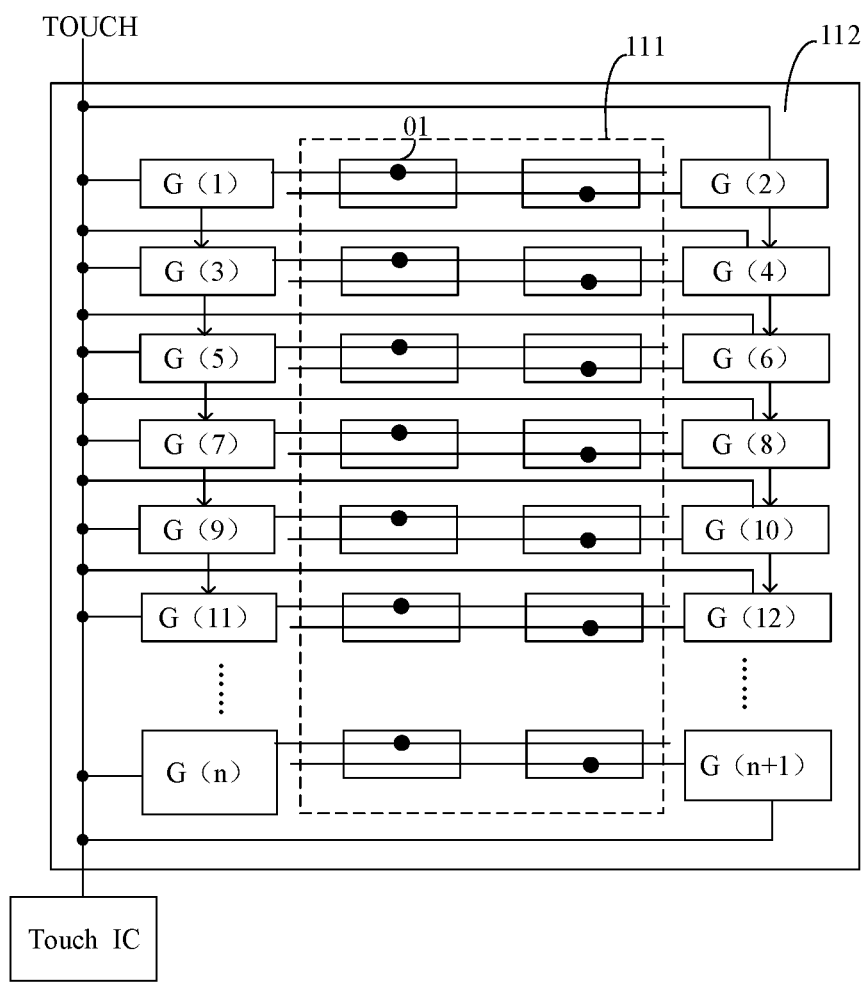
FIG. 10 is a first structural schematic diagrams of a touch display panel provided by an embodiment of the present disclosure.

The embodiment of the present disclosure also provides a touch display panel, and FIG. 10 is a schematic structural diagram of a touch display panel provided by the embodiment of the present disclosure. As shown in FIG. 10, the touch display panel includes a plurality of touch electrodes 01 and the gate driving circuit provided by the above embodiment. For example, a plurality of touch electrodes 01 are located in a display area (touch area) 111 of the touch display panel, and a gate driving circuit is located in a non-display area 112 of the touch display panel. The plurality of shift register units G in the gate driving circuit correspond to the plurality of touch electrodes 01 in a one-to-one correspondence, and the output node of each shift register unit G is connected with the corresponding touch electrode 01.

Figure 13:
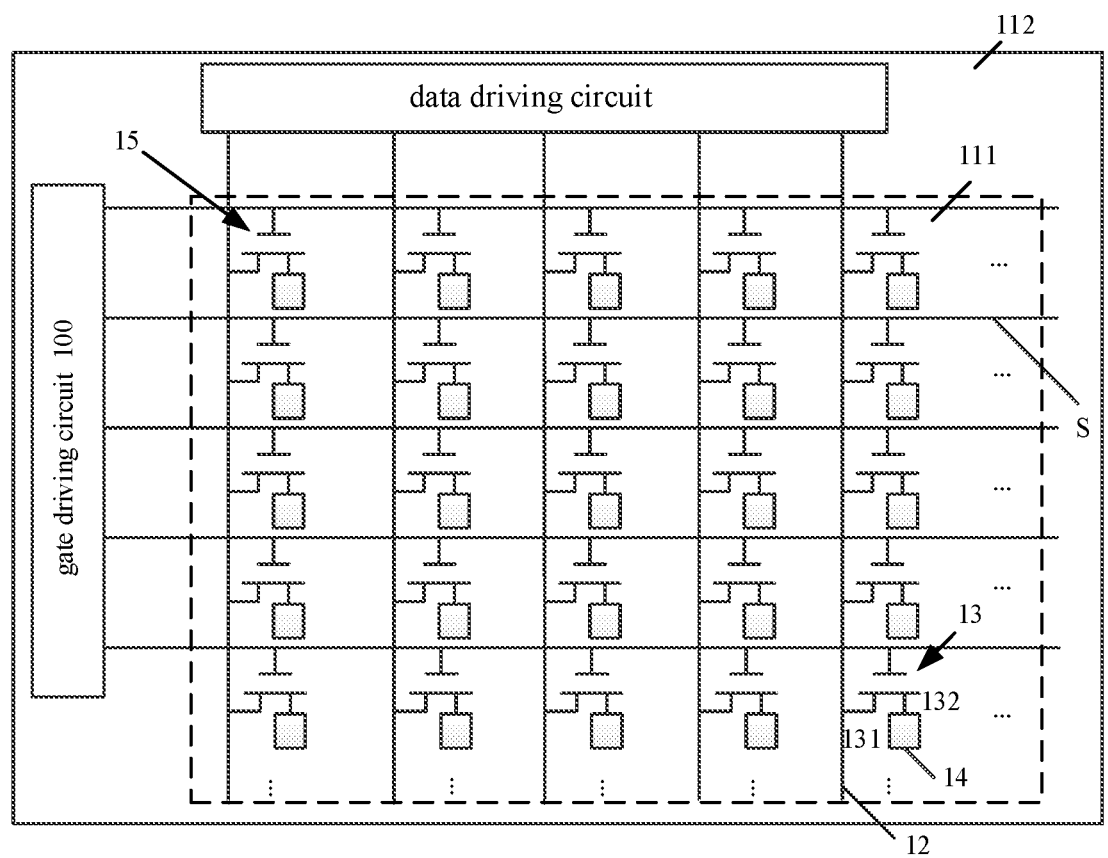
FIG. 13 is a fourth structural schematic diagram of a touch display panel according to an embodiment of the present disclosure.

For example, referring to FIG. 10 and FIG. 13, the touch display panel may further include a touch detection signal line TOUCH, and the plurality of shift register units G may be connected to the touch IC through a same touch detection signal line touch, for example, the non-display area 112 of the touch display panel is provided with bonding electrodes, and the touch IC may be bonded to the bonding electrodes through a flexible printed circuit board (FPC). The touch detection signal line is configured to be respectively connected with the first input node I1 in the plurality of shift register units, and the touch IC respectively provides touch modulation signals to the plurality of shift register units through the touch detection signal line, and receives touch detection signals fed back by the plurality of shift register units and analyzes the touch detection signals to obtain touch positions, thereby realizing a touch detection function.

For example, the touch IC can determine the position of the touch electrode 01 that feeds back the touch detection signal according to the timing of the received touch detection signal and the working timing of the plurality of shift register units, thereby realizing the touch detection function.

Referring to FIG. 13, the touch display panel may further include a common electrode line COM configured to be respectively connected to the second input nodes I2 of the plurality of shift register units to input a common electrode signal to the second input node I2.

Illustratively, referring to FIG. 10, the shift register units Gin the gate driving circuit may be symmetrically arranged in peripheral regions (non-display regions) on both sides of the touch display panel. In which odd-numbered shift register units G are arranged on one side and even-numbered shift register units G are arranged on the other side. Also, referring to FIG. 10, the first-level shift register unit G(1) may be connected to the first touch electrode 01, the second-level shift register unit G(2) may be connected to the second touch electrode 01, and the (n+1)-th-level shift register unit G(n+1) may be connected to the (n+1)-th touch electrode 01.

Since a plurality of shift register units in the gate driving circuit can output driving signals row by row, the touch detection signal line TOUCH can output touch modulation signals to the touch electrodes 01 connected with each shift register unit one by one and receive touch detection signals fed back by the touch electrodes 01 one by one. In addition, referring to FIG. 10, it can be seen that the same touch detection signal line touch connected to the plurality of shift register units G can also be connected to the touch IC, and the touch detection signal line TOUCH can also output the received touch detection signals to the touch IC one by one. Furthermore, the touch IC can determine the position of the touch electrode 01 feeding back the touch detection signal according to the time of the received touch detection signal and the working time sequence of the plurality of shift register units, thereby realizing the touch detection function.

In summary, the embodiment of the present disclosure provides a touch display panel. The touch display panel comprises a plurality of touch electrodes, shift register units which are correspondingly connected with the plurality of touch electrodes in a one-to-one correspondence, and a touch detection signal line which is connected with the plurality of shift register units. As the touch detection signal line can be connected with the plurality of shift register units and a touch IC, and each shift register unit can be connected with one touch electrode. Therefore, touch detection of all touch electrodes included in the touch display panel can be realized by setting a small number of touch detection signal lines, so that the number of traces in lead areas around the touch display panel is smaller.

Figure 11:
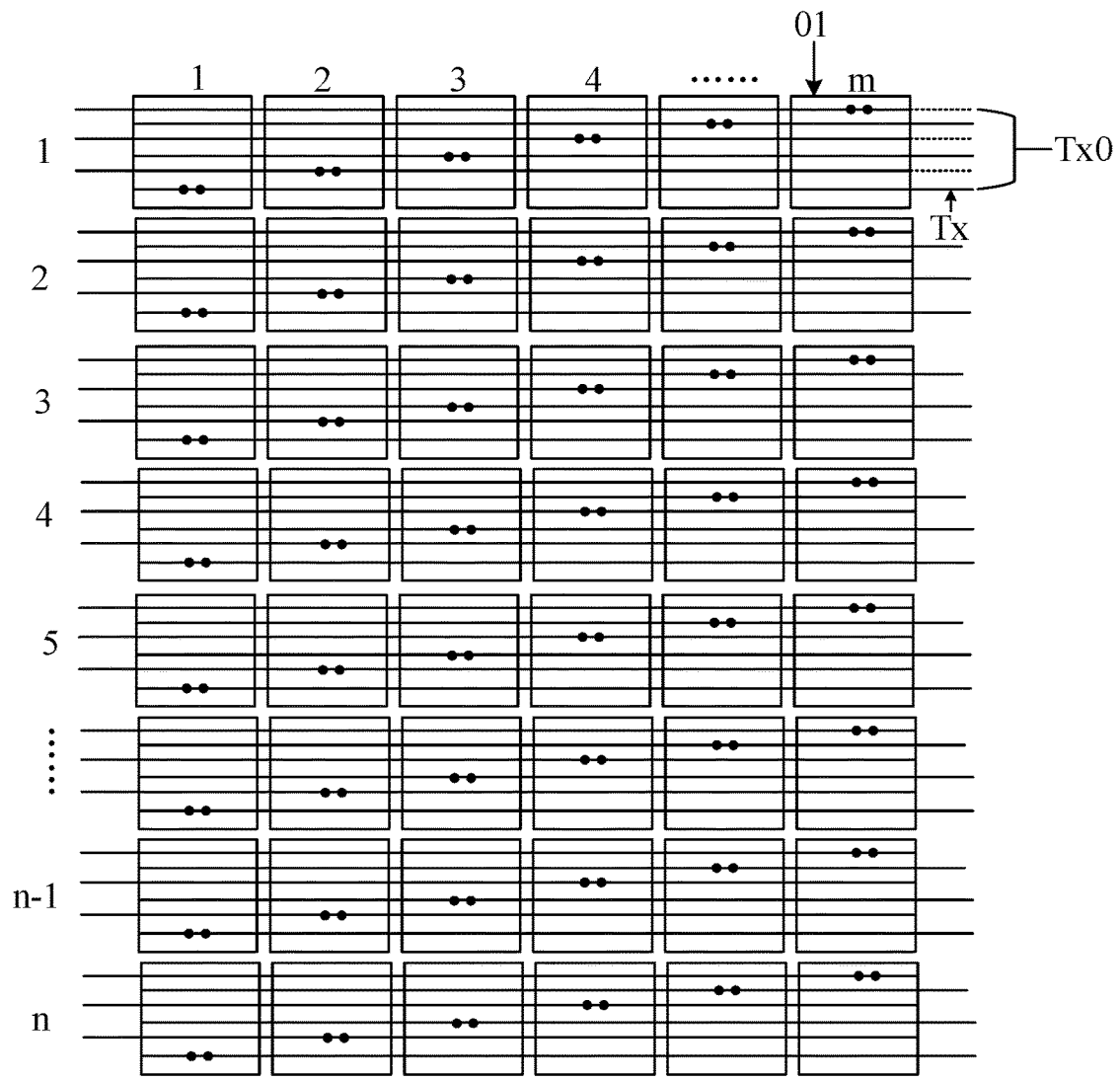
FIG. 11 is a second structural diagram of a touch display panel according to an embodiment of the present disclosure.

FIG. 11 is a schematic structural diagram of a touch display panel provided by another embodiment of the present disclosure. As shown in FIG. 11, the touch display panel may further include a plurality of gate lines (not shown in FIG. 11) and a plurality of touch detection signal lines Tx. A plurality of shift register units respectively correspond to the plurality of gate lines and the plurality of touch detection signal lines in a one-to-one correspondence, the output terminal of the shift circuit in each shift register unit is connected with the corresponding gate line, and the output node in each shift register unit is connected to the corresponding touch electrode through the corresponding touch detection signal line.

For example, as shown in FIG. 11, a plurality of touch electrodes 01 are arranged in an array of N rows and m columns, a plurality of touch detection lines Tx are extended along a row direction of the array, the plurality of touch detection lines Tx are divided into n groups of touch detection signal lines (i.e., N touch detection signal line groups Tx0), and the N groups of touch detection signal lines respectively correspond to N rows of touch electrodes 01 in a one-to-one correspondence; each group of touch detection signal lines comprises M touch detection signal lines which are respectively connected with M touch electrodes 01 in the corresponding row of touch electrodes in a one-to-one correspondence manner; that is, the number of touch detection signal lines is N×M. For example, as shown in FIG. 11, each row of touch electrodes 01 spans M touch detection signal detection lines of the corresponding touch detection signal line group. For example, each row of touch electrodes 01 corresponds to M gate lines and M rows of pixels in the touch display panel.

The N×M touch detection signal lines Tx can be respectively connected with the signal transmission circuits 20 included in the plurality of shift register units for transmitting touch modulation signals from the touch detection signal line TOUCH to the touch electrode 01 and for transmitting touch detection signals fed back by the touch electrode 01 to the touch detection signal line TOUCH.

Figure 12:
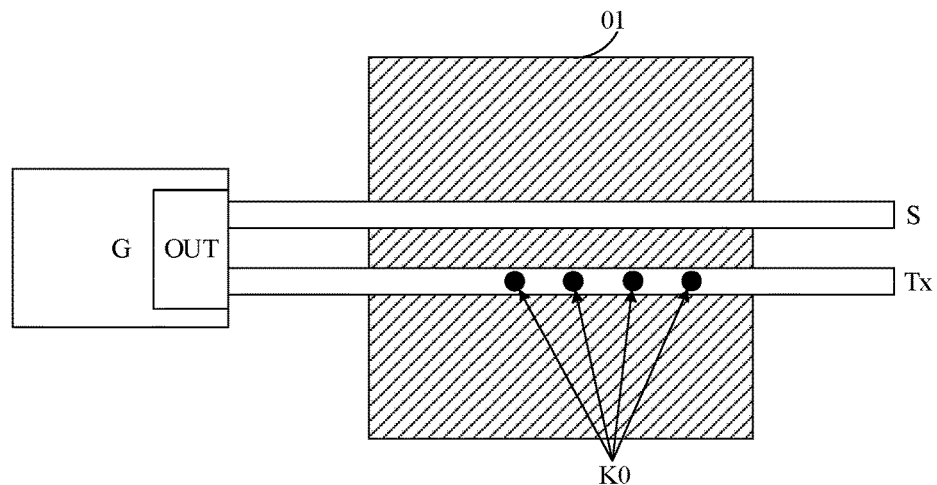
FIG. 12 is a third structural schematic diagram of a touch display panel according to an embodiment of the present disclosure.

FIG. 12 shows a connection relationship between a shift register unit and the corresponding gate line and touch detection signal line, respectively. As shown in FIG. 12, the output terminal OUT of each shift register unit G can be connected with two lines, one of which is the gate line S for controlling a turn-on or turn-off of transistors in a corresponding row of pixel units in the touch display panel; the other is the corresponding touch detection signal line Tx.

For example, as shown in the figure, the gate line S and the touch detection signal line are parallel to each other. For example, in the touch display panel, the plurality of gate lines S and the plurality of touch detection signal lines Tx are parallel to each other.

For example, each touch detection signal line Tx may be connected to one touch electrode 01 through at least one via hole K0. For example, referring to FIG. 12, the touch detection signal line Tx and the touch electrode 01 may be connected through four via holes K0. In addition, the touch detection signal line Tx can be arranged in a same layer as the gate line S, and a material of the touch detection signal line Tx can be same as that of the gate line S.

FIG. 13 shows another schematic diagram of the touch display panel, and for the sake of clarity, touch electrodes and touch detection signal lines are omitted. This embodiment is described by taking a liquid crystal display panel as an example, however, the embodiment of the present disclosure does not limit the type of the display panel. As shown in FIG. 13, the gate driving circuit 100 is disposed in the non-display area 112 of the touch display panel. In the display area 111 of the touch display panel, a plurality of gate lines S and a plurality of data lines 12 are intersected with each other to define a plurality of pixel units 15, and each pixel unit 15 includes a pixel circuit, for example, the pixel circuit including a thin film transistor 13, a pixel electrode 14, and a storage capacitor (not shown) connected to the pixel electrode 14. A gate electrode of the thin film transistor 13 is connected to the gate driving circuit 100 through the gate line S, a first electrode 131 of the thin film transistor 13 is connected to the data drive circuit through the data line 12, and a second electrode 132 is connected to the pixel electrode 14 and the storage capacitor. In the touch period, the gate line S receives the first level of the driving signal, and in response to the first level, the thin film transistor 13 is turned on; the thin film transistor 13 receives a display data signal from the data driving circuit, and the display data signal is transmitted from the first electrode 131 to the second electrode 132 (i.e., the pixel electrode 14) of the thin film transistor and stored in the storage capacitor; in the display period, the touch electrode 01 receives a common electrode signal, and in response to the display data signal and the common electrode signal, the pixel unit 15 realizes a display operation. Referring to FIG. 11 and FIG. 13, for example, each row of touch electrodes 01 corresponds to (spans) M gate lines S and M rows of pixel units in the touch display panel.

The embodiment of the disclosure provides a touch display panel. The touch display panel comprises a plurality of touch electrodes and a gate driving circuit provided by any embodiment of the present disclosure. As a plurality of shift register units in the gate drive circuit can be connected with the touch IC through the same touch detection signal line, and each shift register unit can be connected with one touch electrode. Therefore, touch detection of all touch electrodes included in the touch display panel can be realized by setting a small number of touch detection signal lines, so that the number of traces in lead areas around the touch display panel is smaller.

The embodiment of the disclosure also provides a display device. The display device may include the touch display panel provided by any embodiment of the present disclosure and a touch processing circuit. The touch processing circuit is configured to be respectively connected with the plurality of shift register units in the touch display panel to provide touch modulation signals to the plurality of shift register units and receive the touch detection signals from the plurality of shift register units. For example, referring to FIG. 10, the touch processing circuit is a touch integrated circuit (IC), and the touch IC can be bonded to the non-display area of the touch display panel through the FPC.

For example, the touch IC is connected to the touch detection signal line TOUCH which is connected to each shift register unit in the touch display panel. The touch IC can provide a touch modulation signal to the touch detection signal line TOUCH, so that the touch detection signal line TOUCH outputs the touch modulation signal to the touch electrode 01 connected to each shift register unit, and can receive the touch detection signal fed back by the touch electrode 01 through the touch detection signal line TOUCH. The touch IC can detect whether the touch electrode is touched or not according to the received touch detection signal, thus realizing touch detection.

Since the touch detection signal line touch connected with the touch processing circuit in the embodiment of the present disclosure can be connected with a plurality of shift register units, each shift register unit can be connected with one touch electrode 01. Therefore, a small number of touch detection signal lines touch need to be set for the touch processing circuit to realize touch detection of each touch electrode 01 in the touch display panel, and the number of traces in the lead area around the touch display panel is small.

For example, the display device can be: LTPS display device, a-Si display device, liquid crystal panel, electronic paper, OLED panel, AMOLED panel, mobile phone, tablet computer, television, display, notebook computer, digital photo frame, navigator and other products or components with display function.

The above description is merely related exemplary embodiments of the present disclosure and is not intended to limit the scope of protection of the present disclosure, which is determined by the appended claims.

What is claimed is:

1. A shift register unit, comprising a shift circuit and a signal transmission circuit, wherein an output terminal of the shift circuit is connected with the signal transmission circuit, and the shift circuit is configured to output a driving signal to the signal transmission circuit;
the signal transmission circuit is configured to be connected to a first input node to receive a touch modulation signal, to output the touch modulation signal to an output node, and to feed back a touch detection signal to the first input node in response to a first level of the driving signal.

2. The shift register unit according to claim 1, wherein the driving signal is a gate scan signal, and the output terminal of the shift circuit is further configured to be connected with a scan signal input terminal to provide the driving signal to the scan signal input terminal.

3. The shift register unit according to claim 2, wherein the signal transmission circuit is further configured to be connected to a second input node to receive a common electrode signal and to output the common electrode signal to the output node in response to a second level of the driving signal.

4. The shift register unit according to claim 3, wherein the signal transmission circuit comprises a first signal transmission sub-circuit and a second signal transmission sub-circuit,
the first signal transmission sub-circuit is configured to be respectively connected with the first input node, the output terminal of the shift circuit and the output node, and is configured to receive the touch modulation signal from the first input node and output the touch modulation signal to the output node in response to the first level of the driving signal; and
the second signal transmission sub-circuit is configured to be respectively connected to the output terminal of the shift circuit, the second input node, and the output node, and is configured to receive the common electrode signal from the second input node and output the common electrode signal to the output node in response to the second level of the driving signal.

5. The shift register unit according to claim 4, wherein the second signal transmission sub-circuit comprises a first control sub-circuit and a second control sub-circuit, and the first control sub-circuit is connected to the second control sub-circuit through a first node;
the first control sub-circuit is configured to write a control signal to the first node in response to the driving signal to control a voltage of the first node;
the second control sub-circuit is configured to be connected to the second input node to receive the common electrode signal, and to be connected to the output node to output the common electrode signal to the output node in response to the control signal written to the first node.

6. The shift register unit according to claim 5, wherein the first control sub-circuit comprises an inverting circuit,
an input terminal and an output terminal of the inverting circuit are respectively connected with an output terminal of the shift circuit and the first node, and
the inverting circuit is configured to provide an inverting signal of the driving signal to the first node as the control signal.

7. The shift register unit according to claim 5, wherein the first signal transmission sub-circuit comprises a first transistor,
the first control sub-circuit comprises a second transistor and a third transistor, and
the second control sub-circuit includes a fourth transistor;
a gate electrode of the first transistor is connected with the output terminal of the shift circuit, a first electrode of the first transistor is connected with the first input node to receive the touch modulation signal and to feed back the touch detection signal to the first input node, and a second electrode of the first transistor is connected with the output node;
a gate electrode of the second transistor is connected with the output terminal of the shift circuit, a first electrode of the second transistor is connected with a first power supply terminal, and a second electrode of the second transistor is connected with the first node;
a gate electrode and a first electrode of the third transistor are both connected with a second power supply terminal, and a second electrode of the third transistor is connected with the first node; and
a gate electrode of the fourth transistor is connected to the first node, a first electrode of the fourth transistor is connected to the second input node to receive the common electrode signal, and a second electrode of the fourth transistor is connected to the output node.

8. The shift register unit according to claim 4, wherein the second signal transmission sub-circuit comprises a fifth transistor;
a gate electrode of the fifth transistor is connected to the output terminal of the shift circuit, a first electrode of the fifth transistor is connected to the second input node, and a second electrode of the fifth transistor is connected to the output node.

9. The shift register unit according to claim 1, wherein the shift circuit comprises an input sub-circuit, an output sub-circuit, a reset sub-circuit and a pull-down sub-circuit;
the input sub-circuit is connected to a pull-up node and configured to provide an input signal to the pull-up node in response to a first control signal;
the output circuit is connected to the pull-up node and the output terminal of the shift circuit, and is configured to write the first level of the driving signal to the output terminal of the shift circuit in response to a level of the pull-up node;
the reset sub-circuit is connected to the pull-up node and configured to reset the pull-up node in response to a second control signal; and
the pull-down sub-circuit is connected to the output terminal of the shift circuit and configured to write a second level of the driving signal to the output terminal in response to a third control signal.

10. A method of driving the shift register unit according to claim 1, comprising:
in a touch period, the shift circuit outputting the first level of the driving signal to the signal transmission circuit through the output terminal, and
the signal transmission circuit receiving the touch modulation signal from the first input node, outputting the touch modulation signal to the output node and feeding back the touch detection signal to the first input node in response to the first level of the driving signal.

11. The driving method according to claim 10, further comprising:
in a display period, the shift circuit outputting a second level of the driving signal to the signal transmission circuit through the output terminal, and
the signal transmission circuit receiving the common electrode signal from the second input node and outputting the common electrode signal to the output node in response to the second level of the driving signal.

12. The driving method according to claim 11, further comprising:
    in the touch period, a switching transistor of a pixel unit switching on in response to the first level of the driving signal, and transmitting a display data signal from a first electrode to a second electrode of the switching transistor;
    in the display period, the pixel unit realizing a display operation in response to the display data signal and the common electrode signal.

13. A gate driving circuit, comprising a plurality of cascaded shift register units according to claim 1.

14. A touch display panel, comprising a plurality of touch electrodes and the gate driving circuit according to claim 13, wherein the plurality of shift register units correspond to the plurality of touch electrodes in a one-to-one correspondence;
    the output node of each of the plurality of shift register units is connected with the corresponding touch electrode.

15. The touch display panel according to claim 14, further comprising a plurality of gate lines and a plurality of touch detection signal lines,
    wherein the plurality of shift register units respectively correspond to the plurality of gate lines and the plurality of touch detection signal lines in a one-to-one correspondence,
    the output terminal of the shift circuit in each of the plurality of shift register units is connected with corresponding one of the gate lines, and
    the output node of each of the plurality of shift register units is connected to corresponding one of the touch electrodes through corresponding one of the touch detection signal lines.

16. The touch display panel according to claim 15, wherein the plurality of gate lines and the plurality of touch detection signal lines are parallel to each other in an extension direction.

17. The touch display panel according to claim 15, wherein the plurality of touch electrodes are arranged in an array of N rows and M columns, and the plurality of touch detection signal lines are extended along a row direction of the array;
    the plurality of touch detection lines are divided into N groups of touch detection signal lines, and the N groups of touch detection signal lines respectively correspond to the N rows of touch electrodes in a one-to-one correspondence;
    each of the N groups of touch detection signal lines comprises M touch detection signal lines of the plurality of touch detection lines, and the M touch detection signal lines are respectively connected with M touch electrodes in the corresponding row of touch electrodes in a one-to-one corresponding manner.

18. The touch display panel according to claim 14, further comprising a touch detection signal line,
    wherein the touch detection signal line is configured to be respectively connected with first input nodes of the plurality of shift register units to input the touch modulation signal to the first input nodes and to receive the touch detection signal from the first input nodes.

19. The touch display panel according to claim 14, further comprising a common electrode line,
    wherein the common electrode line is configured to be respectively connected to second input nodes of the plurality of shift register units to input a common electrode signal to the second input node.

20. A display device, comprising the touch display panel according to claim 14 and a touch processing circuit,
    wherein the touch processing circuit is configured to be respectively connected with the plurality of shift register units in the touch display panel to provide touch modulation signals to the plurality of shift register units and to receive touch detection signals from the plurality of shift register units.

* * * * *